US009348339B2

(12) United States Patent
Ding et al.

(10) Patent No.: US 9,348,339 B2
(45) Date of Patent: May 24, 2016

(54) METHOD AND APPARATUS FOR MULTIPLE-CHANNEL PULSE GAS DELIVERY SYSTEM

(75) Inventors: Junhua Ding, Tewksbury, MA (US); Scott Benedict, Nashua, NH (US); Jaroslaw Pisera, Bedford, MA (US)

(73) Assignee: MKS Instruments, Inc., Andover, MA (US)

( * ) Notice: Subject to any disclaimer, the term of this patent is extended or adjusted under 35 U.S.C. 154(b) by 507 days.

(21) Appl. No.: 13/035,534

(22) Filed: Feb. 25, 2011

(65) Prior Publication Data

US 2012/0076935 A1    Mar. 29, 2012

Related U.S. Application Data

(63) Continuation-in-part of application No. 12/893,554, filed on Sep. 29, 2010, now Pat. No. 8,997,686.

(51) Int. Cl.
*C23C 16/455* (2006.01)
*G05D 7/06* (2006.01)

(52) U.S. Cl.
CPC ........ *G05D 7/0635* (2013.01); *C23C 16/45557* (2013.01); *C23C 16/45523* (2013.01); *G05D 7/0623* (2013.01)

(58) Field of Classification Search
CPC ................... C23C 16/45557; C23C 16/45523; G05D 7/0623; G05D 7/0635
See application file for complete search history.

(56) References Cited

U.S. PATENT DOCUMENTS

| 4,783,343 A | 11/1988 | Sato |
| 4,916,089 A | 4/1990 | Van Suchtelen et al. |
| 5,524,084 A * | 6/1996 | Wang et al. .................... 702/100 |
| 5,565,038 A | 10/1996 | Ashley |
| 5,660,207 A | 8/1997 | Mudd |
| 5,865,205 A | 2/1999 | Wilmer |
| 6,000,830 A | 12/1999 | Asano et al. |
| 6,089,537 A * | 7/2000 | Olmsted ................. 251/129.11 |
| 6,119,710 A | 9/2000 | Brown et al. |

(Continued)

FOREIGN PATENT DOCUMENTS

| CN | 101023199 | 8/2007 |
| DE | 102004015174 | 10/2005 |

(Continued)

OTHER PUBLICATIONS

International Search Report and the Written Opinion from corresponding PCT/US2011/053618 dated Jan. 16, 2012.

(Continued)

*Primary Examiner* — Jeffrie R Lund
*Assistant Examiner* — Yuechuan Yu
(74) *Attorney, Agent, or Firm* — McDermott, Will and Emery

(57) ABSTRACT

A pulse gas delivery system for delivering a sequence of pulses of prescribed amounts of gases to a process tool, comprises: (a) a plurality of channels, each including (i) a gas delivery chamber; (ii) an inlet valve connected so as to control gas flowing into the corresponding gas delivery chamber; and (iii) an outlet valve connected so as to control the amount of gas flowing out of the corresponding gas delivery chamber; and (b) a dedicated multiple channel controller configured so as to control the inlet and outlet valves of each of the channels so that pulses of gases in prescribed amounts can be provided to the process tool in a predetermined sequence in accordance with a pulse gas delivery process.

21 Claims, 1 Drawing Sheet

(56) References Cited

U.S. PATENT DOCUMENTS

| | | | |
|---|---|---|---|
| 6,125,869 | A | 10/2000 | Horiuchi |
| 6,269,279 | B1 | 7/2001 | Todate et al. |
| 6,287,980 | B1 | 9/2001 | Hanazaki et al. |
| 6,503,330 | B1 | 1/2003 | Sneh et al. |
| 6,631,334 | B2 | 10/2003 | Grosshart |
| 6,638,859 | B2 | 10/2003 | Sneh et al. |
| 6,820,632 | B2 | 11/2004 | Ohmi |
| 6,911,092 | B2 | 6/2005 | Sneh |
| 6,913,031 | B2 | 7/2005 | Nawata et al. |
| 7,428,373 | B2 | 9/2008 | Sandhu |
| 7,474,968 | B2 | 1/2009 | Ding et al. |
| 7,615,120 | B2 | 11/2009 | Shajii et al. |
| 7,628,860 | B2 | 12/2009 | Shajii et al. |
| 7,628,861 | B2 | 12/2009 | Clark |
| 7,662,233 | B2 | 2/2010 | Sneh |
| 7,735,452 | B2 | 6/2010 | Spartz |
| 7,794,544 | B2 | 9/2010 | Nguyen et al. |
| 7,829,353 | B2 | 11/2010 | Shajii et al. |
| 8,297,223 | B2 | 10/2012 | Liu et al. |
| 2002/0007790 | A1 | 1/2002 | Park |
| 2002/0114732 | A1 | 8/2002 | Vyers |
| 2003/0180458 | A1 | 9/2003 | Sneh |
| 2004/0050326 | A1 | 3/2004 | Thilderkvist et al. |
| 2004/0187928 | A1 | 9/2004 | Ambrosina et al. |
| 2004/0244837 | A1 | 12/2004 | Nawata |
| 2005/0081787 | A1 | 4/2005 | Im et al. |
| 2005/0103264 | A1 | 5/2005 | Jansen |
| 2005/0160983 | A1 | 7/2005 | Sneh |
| 2005/0196533 | A1* | 9/2005 | Hasebe et al. ............ 427/248.1 |
| 2005/0223979 | A1* | 10/2005 | Shajii et al. ................ 118/692 |
| 2005/0249876 | A1 | 11/2005 | Kawahara et al. |
| 2005/0282365 | A1 | 12/2005 | Hasebe et al. |
| 2006/0032442 | A1* | 2/2006 | Hasebe ........................ 118/715 |
| 2006/0060139 | A1 | 3/2006 | Meneghini et al. |
| 2006/0130744 | A1 | 6/2006 | Clark |
| 2006/0130755 | A1 | 6/2006 | Clark |
| 2006/0207503 | A1 | 9/2006 | Meneghini et al. |
| 2007/0026540 | A1 | 2/2007 | Nooten et al. |
| 2007/0039549 | A1 | 2/2007 | Shajii et al. |
| 2007/0204702 | A1* | 9/2007 | Melcer et al. ................... 73/861 |
| 2008/0095936 | A1 | 4/2008 | Senda et al. |
| 2008/0097640 | A1 | 4/2008 | Cho et al. |
| 2008/0167748 | A1 | 7/2008 | Ding |
| 2009/0004836 | A1* | 1/2009 | Singh et al. .................. 438/513 |
| 2009/0008369 | A1* | 1/2009 | Nozawa et al. .......... 219/121.54 |
| 2009/0018692 | A1 | 1/2009 | Yoneda |
| 2009/0163040 | A1* | 6/2009 | Maeda et al. ................ 438/791 |
| 2009/0248213 | A1 | 10/2009 | Gotoh |
| 2010/0125424 | A1 | 5/2010 | Ding et al. |
| 2011/0174219 | A1 | 7/2011 | Meneghini |
| 2012/0073672 | A1 | 3/2012 | Ding |
| 2012/0076935 | A1 | 3/2012 | Ding |
| 2012/0216888 | A1 | 8/2012 | Ding et al. |

FOREIGN PATENT DOCUMENTS

| | | | |
|---|---|---|---|
| EP | 0969342 | | 1/2000 |
| EP | 2006414 | | 12/2008 |
| JP | 61229319 | | 10/1986 |
| JP | 06045256 | | 2/1994 |
| JP | 2000012464 | | 1/2000 |
| JP | 2000200780 | A * | 7/2000 |
| JP | 2002329674 | | 11/2002 |
| JP | 2006222141 | | 8/2006 |
| JP | 2006222141 | A * | 8/2006 |
| JP | 2007535617 | | 12/2007 |
| JP | 2008091625 | | 4/2008 |
| JP | 2009530737 | | 8/2009 |
| KR | 1020090104678 | | 10/2009 |
| WO | 02073329 | | 9/2002 |
| WO | 2005/103328 | | 11/2005 |
| WO | 2007108871 | | 9/2007 |
| WO | WO 2008/112423 | | 9/2008 |

OTHER PUBLICATIONS

International Search Report and the Written Opinion from corresponding PCT/US2011/053614 dated Dec. 9, 2011.
The International Search Report and the Written Opinion of the International Searching Authority from Corresponding PCT Application No. PCT/US2012/026519 dated Jun. 18, 2012.
Office Action dated Nov. 24, 2014 from corresponding German Application No. 112011103330.3.
Office Action dated Nov. 27, 2014 from corresponding German Application No. 112011103337.0.
Office Action dated Jul. 2, 2014 from Corresponding Chinese Application No. 201180056074.1.
Office Action dated Apr. 2, 2014 from Corresponding Japanese Application No. 2013-531758.
Office Action dated Apr. 2, 2014 from Corresponding Japanese Application No. 2013-531756.
English Version of the Search Report dated Jan. 11, 2014 from Corresponding Taiwan Patent Application No. 100135295.
Taiwan Version of Office Action dated Jan. 22, 2014 from Corresponding Taiwan Patent Application No. 100135295.
Office Action dated Feb. 11, 2015 from corresponding Korean Application No. 10-2013-7024954.
International Search Reprot and the Written Opinion dated Jun. 24, 2015 from corresponding PCT Application No. PCT/US2015/015363.
Office Action dated Jun. 18, 2015 from corresponding U.S. Appl. No. 13/344,387.

* cited by examiner

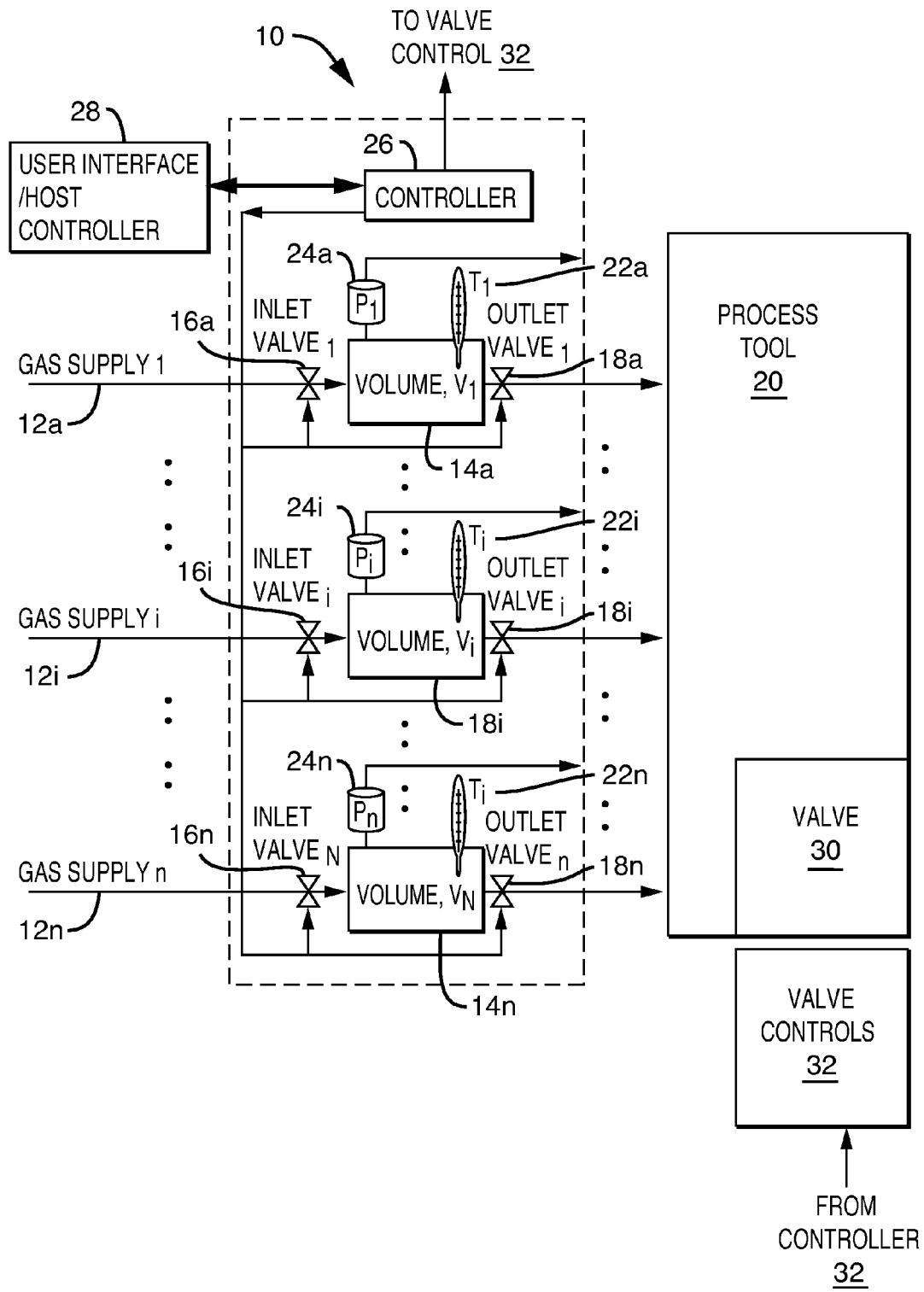

METHOD AND APPARATUS FOR MULTIPLE-CHANNEL PULSE GAS DELIVERY SYSTEM

RELATED APPLICATION

The present application claims priority from and is a continuation-in part of U.S. patent application Ser. No. 12/893,554, entitled SYSTEM FOR AND METHOD OF FAST PULSE GAS DELIVERY, filed Sep. 29, 2010 in the name of Junhua Ding, and assigned to the present assignee.

BACKGROUND

1. Field

This disclosure relates generally to mole or gas delivery devices, and more particularly to a method of and system for fast pulse gas delivery (PGD). As used herein the term "gas(es)" includes the term "vapor(s)" should the two terms be considered different.

2. Overview

The manufacture or fabrication of semiconductor devices often requires the careful synchronization and precisely measured delivery of as many as a dozen gases to a process tool such as a vacuum processing chamber. For purposes herein, the term "process tool" is intended to include both tools and process chambers. Various recipes are used in the manufacturing process, involving many discrete processing steps, where a semiconductor device is typically cleaned, polished, oxidized, masked, etched, doped, metalized, etc. The steps used, their particular sequence, and the materials involved all contribute to the making of particular devices.

As more device sizes have shrunk below 90 nm, one technique known as atomic layer deposition, or ALD, continues to be required for a variety of applications, such as the deposition of barriers for copper interconnects, the creation of tungsten nucleation layers, and the production of highly conducting dielectrics. In the ALD process, two or more precursor gases are delivered in pulses and flow over a wafer surface in a process tool maintained under vacuum. The two or more precursor gases flow in an alternating or sequential manner so that the gases can react with the sites or functional groups on the wafer surface. When all of the available sites are saturated from one of the precursor gases (e.g., gas A), the reaction stops and a purge gas is used to purge the excess precursor molecules from the process tool. The process is repeated, as the next precursor gas (e.g., gas B) flows over the wafer surface. For a process involving two precursor gases, a cycle can be defined as one pulse of precursor A, purge, one pulse of precursor B, and purge. A cycle can include the pulses of additional precursor gases, as well as repeats of a precursor gas, with the use of a purge gas in between successive pulses of two precursor gases. This sequence is repeated until the final thickness is reached. These sequential, self-limiting surface reactions result in one monolayer of deposited film per cycle.

The delivery of pulses of precursor gases introduced into the process tool can be controlled using on/off-type valves which are simply opened for a predetermined period of time to deliver a desired amount (mass) of precursor gas with each pulse into the processing chamber. Alternatively, a mass flow controller, which is a self-contained device comprising a transducer, control valve, and control and signal-processing electronics, is used to deliver an amount of gas (mass) at predetermined and repeatable flow rates, in short time intervals. In both cases, the amount of material (mass) flowing into the process chamber is not precisely measured and controlled.

Systems known as pulse gas delivery (PGD) devices have been developed that can deliver measured pulsed mass flow of precursor gases into semiconductor process tools. Such devices are designed to provide repeatable and precise quantities (mass) of gases for use in semiconductor manufacturing processes, such as atomic layer deposition (ALD) processes.

Single channel PGD devices each include a delivery reservoir or chamber containing the gas to be delivered during the ALD process upstream to the process tool. Gas is introduced into the delivery chamber through an inlet valve during a charging phase (when the corresponding inlet and outlet valves are respectively opened and closed), while gas is delivered from the delivery chamber through an outlet valve during a delivery phase. A pressure sensor and a temperature sensor is used to measure the pressure and temperature of the gas in the delivery chamber, and a dedicated controller is used to sense the pressure and temperature information and control the opening and closing of the inlet and output valves. Since the volume of the delivery chamber is fixed and known, the amount of gas, measured moles, delivered with each pulse is a function of the gas type, the temperature the gas in the chamber, and the pressure drop of the gas during the duration of the pulse.

Multiple channel PGD devices include multiple delivery chambers, each containing a precursor or purge gas used in a gas delivery process. Each precursor and purge gas used in a process can then be introduced through a different channel. This allows the device to operate in the charging phase for one gas provided in one channel, while delivering pulses of a gas provided in another channel. The flow of the pulse of gas from each delivery chamber is controlled with a corresponding on/off-type outlet valve between the delivery chamber of the PGD and the process tool receiving the gas. The amount of time the valve is required to be open to deliver a pulse of gas of a given mass is a further function of the starting pressures of the gas in the corresponding delivery chamber and the downstream pressure of the processing tool. For example, for a given amount of gas that needs to be delivered, the starting pressure in the delivery chamber at a higher starting pressure requires a shorter time for the valve to be open than at a lower starting pressure since the mass flow occurs more quickly at the higher starting pressure. The charge period and the delivery period of PGDs are tightly controlled for fast pulse gas delivery applications in order to insure accurate delivery of prescribed amounts of gas(es). As a result, the upstream pressure of the PGDs as well as the charged pressure in the PGDs are tightly controlled in order to meet the repeatability and the accuracy requirement of the ALD process. By using multiple channels, and staggering the charging and delivery phases of the channels, the sequential delivery of pulses of different gases can be faster than achieved by a single channel device since it is possible to charge a delivery chamber of one channel, while delivering a predetermined amount of gas from the delivery chamber of another channel.

Current multichannel PGD devices include a separate dedicated channel controller for operating each channel. Each channel controller receives all of its commands from the tool/host controller used to control the process in the tool. In this way each channel is controlled by the tool/host controller so that the entire process can be coordinated and controlled by that central controller. Thus, during a process run, the tool/host controller continually sends instruction commands to each channel controller to insure the timely and coordinated delivery of the individual pulses of gas from the multiple channels.

More recently, certain processes have recently been developed that require high speed pulsed or time-multiplexed processing. For example, the semiconductor industry is developing advanced, 3-D integrated circuits thru-silicon vias (TSVs) to provide interconnect capability for die-to-die and wafer-to-wafer stacking Manufacturers are currently considering a wide variety of 3-D integration schemes that present an equally broad range of TSV etch requirements. Plasma etch technology such as the Bosch process, which has been used extensively for deep silicon etching in memory devices and MEMS production, is well suited for TSV creation. The Bosch process, also known as a high speed pulsed or time-multiplexed etching, alternates repeatedly between two modes to achieve nearly vertical structures using $SF_6$ and the deposition of a chemically inert passivation layer using $C_4F_8$. Targets for TSV required for commercial success are: adequate functionality, low cost and proven reliability.

The high speed processes require fast response times between successive pulses in order to better control the processes. While multichannel PGD devices have made the processes possible, in general the faster the device can transition between the alternating etch- and passivation steps the better the control of the process. Timing is very important for controlling the etching and passivation steps, particularly the time it takes to introduce the passivation gas following a etching step so that the etching step is stopped at a precise time. The faster the steps can be performed the better.

Accordingly, it is desirable to design a multichannel PGD device that can carry out high speed processes faster, without sacrificing the advantages of a multichannel PDG device.

DESCRIPTION OF RELATED ART

Examples of pulse mass flow delivery systems can be found in U.S. Pat. Nos. 7,615,120; 7,615,120; 7,628,860; 7,628,861, 7,662,233; 7,735,452 and 7,794,544; U.S. Patent Publication Nos. 2006/0060139; and 2006/0130755, and pending U.S. application Ser. Nos. 12/689,961, entitled CONTROL FOR AND METHOD OF PULSED GAS DELIVERY, filed Jan. 19, 2010 in the name of Paul Meneghini and assigned the present assignee and parent application Ser. No. 12/893,554, entitled SYSTEM FOR AND METHOD OF FAST PULSE GAS DELIVERY, filed Sep. 29, 2010 in the name of Junhua Ding, and assigned to the present assignee.

SUMMARY

In accordance with one aspect an improved multi-channel PGD system comprising a dedicated multichannel controller configured so as to receive all of the instructions from the host controller or a user interface prior to running all of the process steps to be carried out by the PGD system. The multichannel controller is thus configured to control all of the individual channels through the steps of an etch-passivation process where a gas is introduced into a process tool to perform an etching process followed by the introduction of a second passivation gas to stop the etching process. The dedicated multichannel controller thus can be easily programmed to provide control signals for the multiple channels for the entire process, reducing the computing overhead of the host controller so that it is free to carry out other functions relating to the process tool. In one embodiment, the host computer or user interface provides a start command to the dedicated multichannel controller, and the controller singularly runs the process by providing all of the commands to the individual components of all of the channels while receiving the signals from the pressure and temperature sensors of the channels.

In accordance with one aspect of the teachings described herein, a pulse gas delivery system for delivering a sequence of pulses of prescribed amounts of gases to a process tool, comprises:
 a plurality of channels, each including:
  a gas delivery chamber;
  an inlet valve connected so as to control gas flowing into the corresponding gas delivery chamber; and
  an outlet valve connected so as to control the amount of gas flowing out of the corresponding gas delivery chamber; and
 a dedicated multiple channel controller configured so as to control the inlet and outlet valves of each of the channels so that pulses of gases in prescribed amounts can be provided to the process tool in a predetermined sequence in accordance with a pulse gas delivery process.

In accordance with another aspect of the teachings described herein, a combination of a process tool system and a pulse gas delivery system for delivering a sequence of pulses of prescribed amounts of gases to a process tool is provided, wherein the pulse gas delivery system comprises:
 a plurality of channels, each including
  a gas delivery chamber;
  an inlet valve connected so as to control gas flowing into the corresponding gas delivery chamber; and
  an outlet valve connected so as to control the amount of gas flowing out of the corresponding gas delivery chamber;
 a dedicated multiple channel controller configured so as to control the inlet and outlet valves of each of the channels so that pulses of gases in prescribed amounts can be provided to the process tool in a predetermined sequence in accordance with a pulse gas delivery process. The multiple channel controller can be configured to multiplex the charging and the delivery steps among multiple channels such that the overall pulse gas delivery rate is increased.

In accordance with yet another aspect of the teachings described herein, a method of delivering a sequence of pulses of prescribed amounts of gases to a process tool using a pulse gas delivery system is provided. The gas delivery system is of a type comprising a plurality of channels, each channel including a gas delivery chamber; an inlet valve connected so as to control gas flowing into the corresponding gas delivery chamber; an outlet valve connected so as to control the amount of gas flowing out of the corresponding gas delivery chamber; and a dedicated multiple channel controller. The method comprises: configuring the dedicated multiple channel controller so that the controller controls the inlet and outlet valves of each of the channels so that pulses of gases in prescribed amounts can be provided to the process tool.

In accordance with yet another aspect of the teachings described herein, a method of delivering a sequence of pulses of prescribed amounts of gases to a process tool using a pulse gas delivery system is provided. The gas delivery system is of a type comprising a plurality of channels, each channel including a gas delivery chamber; an inlet valve connected so as to control gas flowing into the corresponding gas delivery chamber; an outlet valve connected so as to control the amount of gas flowing out of the corresponding gas delivery chamber; and a dedicated multiple channel controller. The dedicated multiple channel controller is configured to generate a pre-delivery trigger signal correspond to each pulse, wherein the pre-delivery signal includes information relating the gas type and amount of gas to be delivered in a corresponding pulse. The pre-delivery signal can be used by a pressure control valve to control pressure within the process tool during the delivery of the corresponding pulse.

These, as well as other components, steps, features, objects, benefits, and advantages, will now become clear from a review of the following detailed description of illustrative embodiments, the accompanying drawings, and the claims.

BRIEF DESCRIPTION OF DRAWING

The drawing discloses illustrative embodiments. It does not set forth all embodiments. Other embodiments may be used in addition or instead. Details which may be apparent or unnecessary may be omitted to save space or for more effective illustration. Conversely, some embodiments may be practiced without all of the details which are disclosed.

The FIGURE is a block diagram of one embodiment of a multichannel gas delivery system utilizing a dedicated multichannel controller configured to provide high speed pulse delivery.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

The FIGURE shows a block diagram of one embodiment of a multichannel PGD system including a dedicated multichannel controller constructed to provide control of high speed pulse delivery of a gas. The system 10 and method carried out by using the system are particularly intended to deliver contaminant-free, precisely metered quantities of process gases to a semiconductor tool, such as a semiconductor processing chamber, or a plasma etching machine.

As shown in the FIGURE, the system 10 includes multiple channels 12. Each channel 12 is a gas supply line connected to a gas supply (not shown) and configured to provide a specific gas to a corresponding delivery chamber 14. An inlet valve 16 controls the flow into a corresponding delivery chamber 14. Flow out of each delivery chamber 14 is controlled by a corresponding outlet valve 18 so as to deliver a precise amount of gas to a process chamber or tool 20. In the illustrated embodiment, the inlet and outlet valves are shut-off valves having relatively fast shut off responses, i.e., transition from an open state to a shut off state on the order of one to five milliseconds, although this can clearly vary. A temperature sensor 22 and pressure sensor 24 are provided for each delivery chamber so that the amount of gas delivered from each delivery chamber to the process chamber can be carefully controlled as a function of the temperature and pressure of the gas in the particular delivery chamber, the type of gas, as well as the time the corresponding outlet valve is open. According to one exemplary embodiment of the present disclosure, the temperature sensor 20 is in contact with, and provides measurement of the temperature of a wall of the corresponding delivery chamber 12, while the pressure sensor 24 provides the measurement of the gas pressure inside the delivery chamber 12. A dedicated controller 26 is provided to receive readings from the corresponding temperature and pressures sensors 22 and 24, as well as operate the inlet and outlet valves 16 and 18. The dedicated multichannel controller 26 receives instructions from a user interface or host controller 28. The dedicated controller 26 can be configured to multiplex the charging and the delivery steps among multiple channels such that the overall pulse gas delivery rate can be increased.

In accordance with one embodiment, the dedicated multichannel controller 26 is provided with all of the instructions for carrying out the steps of a PDG process, including receiving the temperature and pressure signals from each of the corresponding temperature and pressure sensors 22 and 24, and the opening and closing of each of the inlet and outlet valves 16 and 18 in the proper sequence. The program is stored on the controller so that the system 10 can run an entire process with a single start command from the host computer or use interface 28, without further need for the user or the host computer to interact with the system, unless it is desired to prematurely end the process. In the later case a single stop command can be initiated and provided to the multichannel controller. This approach provides better feedback, and also reduces the amount of computer overhead for the host computer, or less interaction by the user through the user interface. Further, such process steps are repeatable within very tight tolerances. Analysis has revealed that the effective flow rate can be approximately 3.5 times faster than when flow in each channel is controlled by a corresponding mass flow controller (MFC) for example. One example provides a delivery of 1000 micro-moles SF6 or C4F8 within 100 msec.

In operation, the process steps for the multichannel PGD device 10 are provided to the dedicated delivery controller 26 by uploading a recipe program to the controller 26 through the user interface or host controller 28. Once the controller is properly programmed and configured, the operation of pulse gas delivery in various channels can be staggered providing a faster response between the sequence of steps. As mentioned above the amount of mass delivered with each pulse is a function of the temperature and pressure measurements received from the respective temperature and pressure sensors 22 and 24, as well as the initial pressure and the pressure drop within the corresponding delivery chamber 14.

The dedicated multichannel controller 26 is configured to provide data and instructions to and from the components making up each of the channels, as well as any additional data and instructions to and from a user interface/host computer 28. The user interface/host computer 28 can be any suitable device such as a computer including a keyboard and monitor configured so that an operator can operate the PGD system 10. It should be apparent, that wherein the host computer is the computer used to operate the tool, the use of the dedicated controller to run the sequence of steps frees up operating overhead of the host computer, allowing it to operate more efficiently.

The following is a summary of some of the advantages:

1. Existing PGD systems that are used to control flow to a process tool are controlled by a host computer (that runs the entire process tool). The host computer also runs the PGD system by sending control signals to the individual active components of the system, as well as process the signals received from the pressure and temperature sensors. The control logic for running the PGD system is thus on the host computer associated with the process tool. For a PGD system such as shown in the FIGURE of the present application, a dedicated multiple channel controller for the PGD system is used to take over the control logic and timing. With this arrangement the host need only send a command to start pulsing. The result is that a lot of the processing overhead that was previously done on the host computer has been shifted to the dedicated multichannel controller. This frees up the host computer overhead so that the host computer can do other functions. This allows the host computer to grab more data, read more instruments, etc.

2. In a PGD process there are typically two separate PGD devices (one for the etching gas, and the other for the passivation gas), and with existing systems the host computer has been used to operate both. But under such an arrangement, the host communicates with one, then the other. The host is thus required to synchronize the operation of the two. With the present arrangement both PGD devices can be controlled by the dedicated multichannel controller. This results in taking over double the overhead. Again this frees up the host computer. The multiple channel PGD can further increase the overall pulse gas delivery rate by multiplexing the delivery and the charging steps among multiple channels.

3. The dedicated multichannel controller can also provide control signals to other devices on the tool independently of the host, particularly those devices requiring control in connection with the tool process. For example, very tight synchronization is required between the timing of when you pulse the gases, and the operation of other devices (such as the open position of a pendulum valve used to control the pressure of in the tool chamber). With close coordination of timing results in high throughput of the gases. In existing systems, the host computer has to do all of the coordination. The host computer thus has to tell the PGD system to pulse, and then tell the pendulum valve to move. This requires careful synchronization to insure the process behaves correctly. This allows better synchronization while freeing up the control logic and processing time on the host computer.

The foregoing results in reducing the costs of the PGD system when compared to a prior art system of the type in which the host controller is used to run the process. The arrangement further allows for faster autonomous operations. The multichannel pulse gas delivery system can multiplex the charging and the delivery processes on various channels such that it achieves a faster delivery rate among the sequence of multichannel pulse gas delivery steps than that of the multiple single-channel pulse gas delivery systems controlled by a host computer. For example, while one channel is in the delivery step, the other channels can be in the charging mode in the multichannel pulse gas delivery system. The net effect is that the delivery rate is increased. This is opposite to the multiple single channel pulse gas delivery system when the next pulse gas delivery needs wait for the completion of the previous pulse gas delivery which contains both the charging step and the delivery step in a single channel device. In a comparative example, the overall delivery rate at which the steps of a charging and delivery process can be currently carried out on a multiple single-channel pulse gas delivery system controlled with a host computer is typically 5 Hz, while the delivery rate at which the steps of a charging and delivery process can be currently carried out on a multiple-channel pulse gas delivery system controlled with a dedicated controller such as shown at 26 of the FIGURE is typically 10 Hz. The dedicated controller 26 can also be used to provide a pre-delivery trigger signal to other devices on the process tool to do other operations. For example, it can be used to provide control signals (from controller 26 to valve controls 32) to open and precisely control the open position of a valve, generally shown at 30 and typically in the form of a throttle or pendulum valve, used to control the pressure in a process chamber of a tool 20 at the output of the process chamber. In the past the throttle or pendulum valve 30 only operates based on a measurement of the pressure in the chamber with no communication with the PGD system. With the proposed system, the multichannel PGD controller can be used to control the open position of the throttle or pendulum valve so as to maintain the pressure within the process chamber. By using the dedicated processor to control the multiple channels to generate the trigger signal (a signal that says get ready for the train of pulses), one reduces the overhead of the tool processor. The triggering or pre-delivery signal prepares the downstream equipment prior to the running of the process. The dedicated controller can generate a pre-delivery trigger signal for each pulse. In the latter case each pre-delivery signal for each pulse may contain information relating to the pulse to be delivered, such as the amount and type of gas to be delivered. Such information can be correlated to the position of the valve such as a pendulum or throttle valve used to control the pressure within the process tool. The configuration of multiple pulse gas delivery process can be uploaded from the host controller or user interface prior to running the process so that the host controller can do more. This is even a greater advantage if there are more that one PGD system used and the host is used to synchronize them with regard to each other. Finally, the dedicated controller provides output signals to the tool independent of the host.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

What is claimed is:

1. A pulse gas delivery system for delivering a sequence of pulses of prescribed mass amounts of gases to a process chamber that includes a chamber valve configured to control a pressure within the process chamber, the system comprising: a plurality of channels, each including, a gas delivery chamber; an inlet valve connected so as to control gas flowing into the corresponding gas delivery chamber; and an outlet valve connected so as to control an amount of gas flowing out of the corresponding gas delivery chamber; and a dedicated multiple channel controller configured so as to control the inlet and outlet valves of each of the channels so that pulses of gases in prescribed amounts can be provided to the process chamber in a predetermined sequence in accordance with a pulse gas delivery process; wherein the dedicated multiple channel controller is configured so as to generate for each channel a pre-delivery trigger signal corresponding to each pulse for that channel, wherein the pre-delivery trigger signal includes a gas type and a pulse mass of gas to be delivered in a corresponding pulse, wherein the dedicated multiple channel controller is configured to provide command signals to the process chamber, and wherein the dedicated multiple channel controller is configured to provide the pre-delivery trigger signal to open and precisely control an open position of the chamber valve so as to control the pressure within the process chamber.

2. The pulse gas delivery system according to claim 1, wherein the process chamber is of a type including a host computer, wherein the pulse gas delivery process is initiated by an instruction provided by the host computer to the dedicated multiple channel controller.

3. The pulse gas delivery system according to claim 1, further including a user interface coupled to the dedicated multiple channel controller so that the pulse gas delivery process is initiated by an instruction provided through the user interface to the dedicated multiple channel controller.

4. The pulse gas delivery system according to claim 1, wherein each channel further includes a temperature sensor arranged so as to provide a signal representative of a temperature of the gas in the delivery chamber, and a pressure sensor arranged so as to provide a signal representative of a pressure of the gas in the delivery chamber.

5. The pulse gas delivery system according to claim 4, wherein the prescribed amount of each pulse of gas delivered to the chamber is a function of the temperature of the gas in the corresponding delivery chamber, and a pressure drop of the gas in the corresponding delivery chamber during a duration of the pulse.

6. The system according to claim 1, wherein the chamber valve is a pendulum valve.

7. The pulse gas delivery system according to claim 1, wherein instructions regarding an operation of multiple channels are uploaded from a host computer associated with the process chamber, or through a user interface.

8. The system according to claim 1, wherein the dedicated multiple channel controller is configured to control the inlet and outlet valves of each of the channels during a gas delivery process independently of a host controller.

9. The pulse gas delivery system according to claim 8, wherein the host controller triggers an initiation of the delivery process.

10. The combination of a process chamber system having a process chamber and a pulse gas delivery system for delivering a sequence of pulses of prescribed mass amounts of gases to the process chamber, the pulse gas delivery system comprising: a plurality of channels, each including a gas delivery chamber; an inlet valve connected so as to control gas flowing into the corresponding gas delivery chamber; and an outlet valve connected so as to control an amount of gas flowing out of the corresponding gas delivery chamber; and a dedicated multiple channel controller configured so as to control the inlet and outlet valves of each of the channels so that pulses of gases in prescribed amounts can be provided to the process chamber in a predetermined sequence in accordance with a pulse gas delivery process; wherein the dedicated multiple channel controller is configured so as to generate for each channel a pre-delivery trigger signal corresponding to each pulse for that channel, wherein the pre-delivery trigger signal includes a gas type and a pulse mass of gas to be delivered in a corresponding pulse, wherein the dedicated multiple channel controller is configured to provide command signals to the process chamber, and wherein the process chamber includes a chamber valve configured to control a pressure within the process chamber, and the dedicated multiple channel controller is configured to provide the pre-delivery trigger signal to open and precisely control the open position of the chamber valve so as to control the pressure within the process chamber.

11. The combination according to claim 10, wherein the dedicated multiple channel controller is configured to control the inlet and outlet valves of each of the channels during a gas delivery process independently of a host controller.

12. The combination according to claim 11, wherein the host controller triggers an initiation of the delivery process.

13. The combination according to claim 10, wherein each channel further includes a temperature sensor arranged so as to provide a signal representative of a temperature of the gas in the delivery chamber, and a pressure sensor arranged so as to provide a signal representative of a pressure of the gas in the delivery chamber.

14. The combination according to claim 10, wherein the dedicated multiple channel controller is further configured to generate the pre-delivery trigger signal for preparing the process chamber prior to a running of the pulse gas delivery process.

15. A method of delivering a sequence of pulses of prescribed mass amounts of gases to a process chamber that includes a chamber valve configured to control a pressure within the process chamber, using a pulse gas delivery system comprising a plurality of channels, each channel including a gas delivery chamber; an inlet valve connected so as to control gas flowing into the corresponding gas delivery chamber; an outlet valve connected so as to control an amount of gas flowing out of the corresponding gas delivery chamber; and a dedicated multiple channel controller; the method comprising: configuring the dedicated multiple channel controller so that it controls the inlet and outlet valves of each of the channels so that pulses of gases in prescribed amounts can be provided to the process chamber in a predetermined sequence in accordance with a pulse gas delivery process; wherein the dedicated multiple channel controller is configured so as to generate for each channel a pre-delivery trigger signal corresponding to each pulse for that channel, wherein the pre-delivery trigger signal includes a gas type and a pulse mass of gas to be delivered in a corresponding pulse, wherein the dedicated multiple channel controller is configured to provide command signals to the process chamber, and wherein the dedicated multiple channel controller is configured to provide the pre-delivery trigger signal to open and precisely control an open position of the chamber valve so as to control the pressure within the process chamber.

16. The method according to claim 15, wherein the dedicated multiple channel controller is configured so as to control each channel as a function of a temperature and a pressure of the gas in each channel.

17. A multichannel pulse gas delivery system for use with a process chamber that includes a chamber valve configured to control a pressure within the process chamber and a host controller, the system comprising: a plurality of channels, each channel including a gas delivery chamber, a pressure sensor configured so as to measure pressure in the delivery chamber; an inlet valve connected so as to control gas flowing into the corresponding gas delivery chamber; and an outlet valve connected so as to control an amount of gas flowing out of the corresponding gas delivery chamber; and a dedicated multiple channel controller; wherein the dedicated multiple channel controller is configured to control and coordinate each of the channels so that steps of a charging and a delivery process are multiplexed; wherein the dedicated multiple channel controller is configured so as to generate for each channel a pre-delivery trigger signal corresponding to each pulse for that channel, wherein the pre-delivery trigger signal includes a gas type and a pulse mass of gas to be delivered in a corresponding pulse, wherein the dedicated multiple channel controller is configured to provide command signals to the process chamber, and wherein the dedicated multiple channel controller is configured to provide the pre-delivery trigger signal to open and precisely control an open position of the chamber valve so as to control the pressure within the process chamber.

18. The multichannel pulse gas delivery system according to claim 17, wherein each channel further includes a temperature sensor arranged so as to provide a signal representative of a temperature of the gas in the delivery chamber, and the pressure sensor is arranged so as to provide a signal representative of pressure of the gas in the delivery chamber.

19. The multichannel pulse gas delivery system according to claim 17, wherein the pre-delivery trigger signal further includes information relating to a position of the chamber valve that is needed to control the pressure within the process chamber during the delivery of the corresponding pulse.

20. The multichannel pulse gas delivery system according to claim 17, wherein the chamber valve is a pendulum valve.

21. The multichannel pulse gas delivery system according to claim 17, wherein the chamber valve is a throttle valve.

* * * * *